United States Patent
Dadurian

(10) Patent No.: US 6,446,233 B1
(45) Date of Patent: Sep. 3, 2002

(54) FORWARD ERROR CORRECTION APPARATUS AND METHODS

(75) Inventor: Tan C. Dadurian, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/393,399

(22) Filed: Sep. 10, 1999

(51) Int. Cl.[7] .............................................. G06F 11/10
(52) U.S. Cl. ...................................... 714/752; 714/784
(58) Field of Search ................................. 714/752, 746, 714/784, 785

(56) References Cited

U.S. PATENT DOCUMENTS

| | | | |
|---|---|---|---|
| 4,162,480 A | 7/1979 | Berlekamp | 340/146.1 |
| 4,644,543 A | 2/1987 | Davis, Jr. | 371/37 |
| 5,170,399 A | 12/1992 | Cameron et al. | 371/37.1 |
| 5,323,402 A | 6/1994 | Vaccaro et al. | 371/37.1 |
| 5,592,404 A | 1/1997 | Zook | 364/746.1 |
| 5,602,857 A | 2/1997 | Zook et al. | 371/40.1 |
| 5,642,367 A | 6/1997 | Kao | 371/40.1 |
| 5,680,340 A | 10/1997 | Glover et al. | 364/746.1 |
| 5,694,330 A | 12/1997 | Iwamura et al. | 364/496 |
| 5,774,648 A | 6/1998 | Kao et al. | 395/185.01 |
| 5,818,855 A | 10/1998 | Foxcroft | 371/37.8 |
| 5,883,907 A | * 3/1999 | Hoekstra | |
| 6,061,826 A | * 5/2000 | Thirumoorthy et al. | |
| 6,209,115 B1 | * 3/2001 | Truong et al. | |

* cited by examiner

Primary Examiner—Phung M. Chung

(57) ABSTRACT

Forward error correction apparatus and methods are described. A forward error correction system includes multiplier for computing an erasure location polynomial. An erasure location is applied to an input of a input register. An output of a given register in a series of registers and an output of the input register are multiplied to produce a product. The product and an output of the dummy register are added to produce a sum. The sum is applied to an input of a subsequent register immediately following the given register. The subsequent register is treated as the given register and the above-described steps are repeated for each of the erasure locations. A two-buffer method and apparatus for computing an error location polynomial using the Berlekamp error correction algorithm also is described.

12 Claims, 10 Drawing Sheets

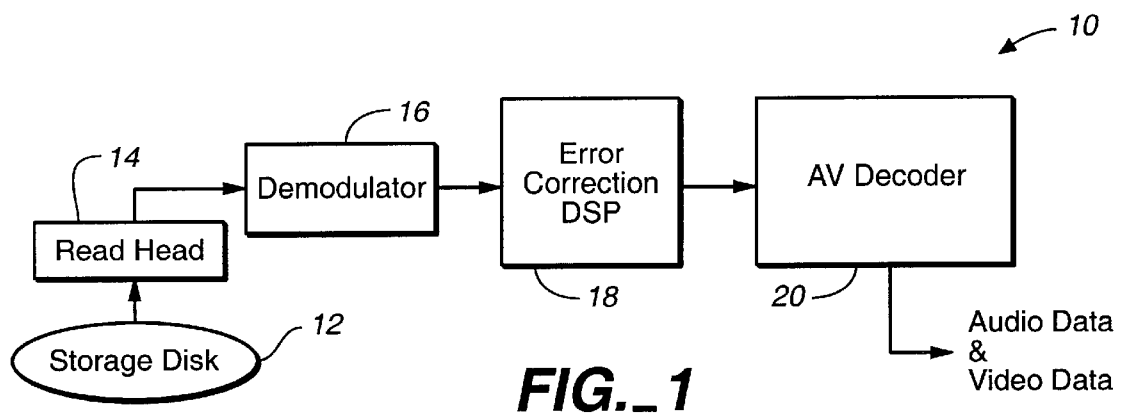
FIG._1
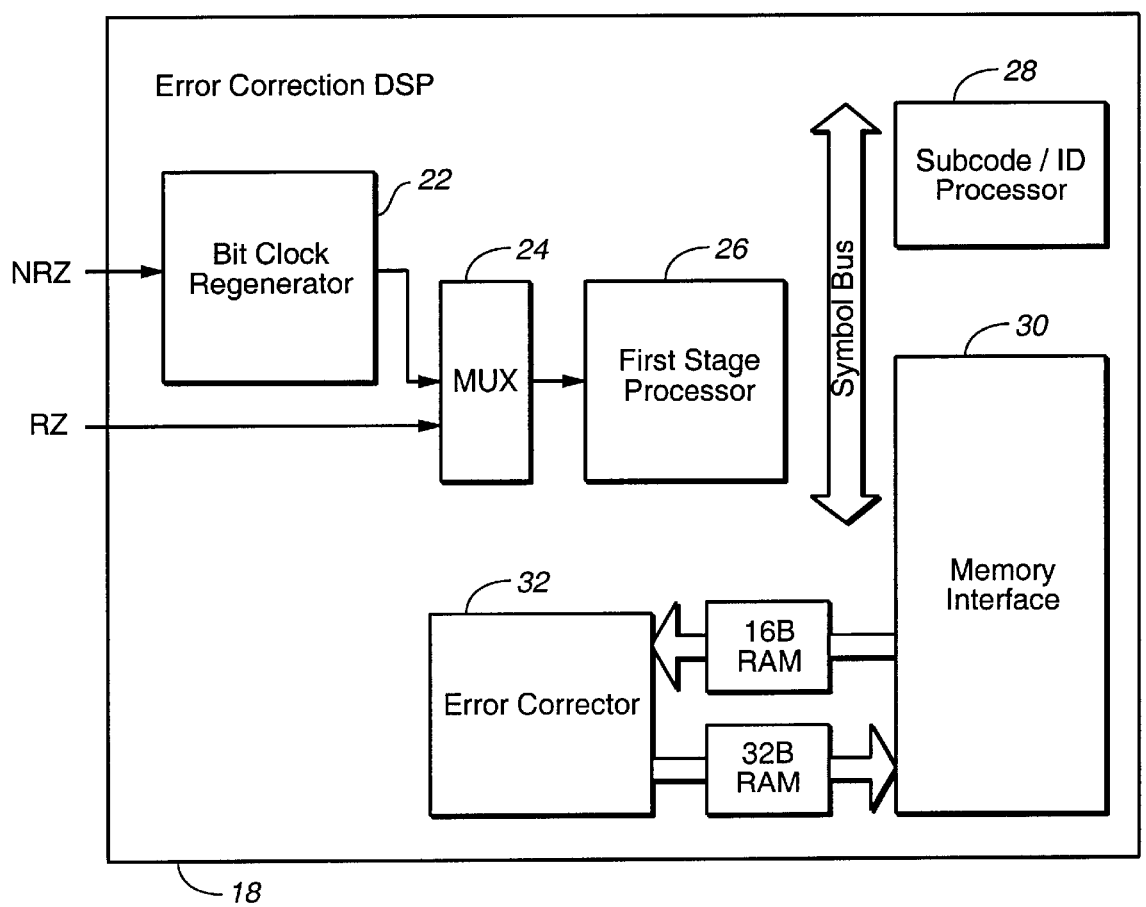
FIG._2A

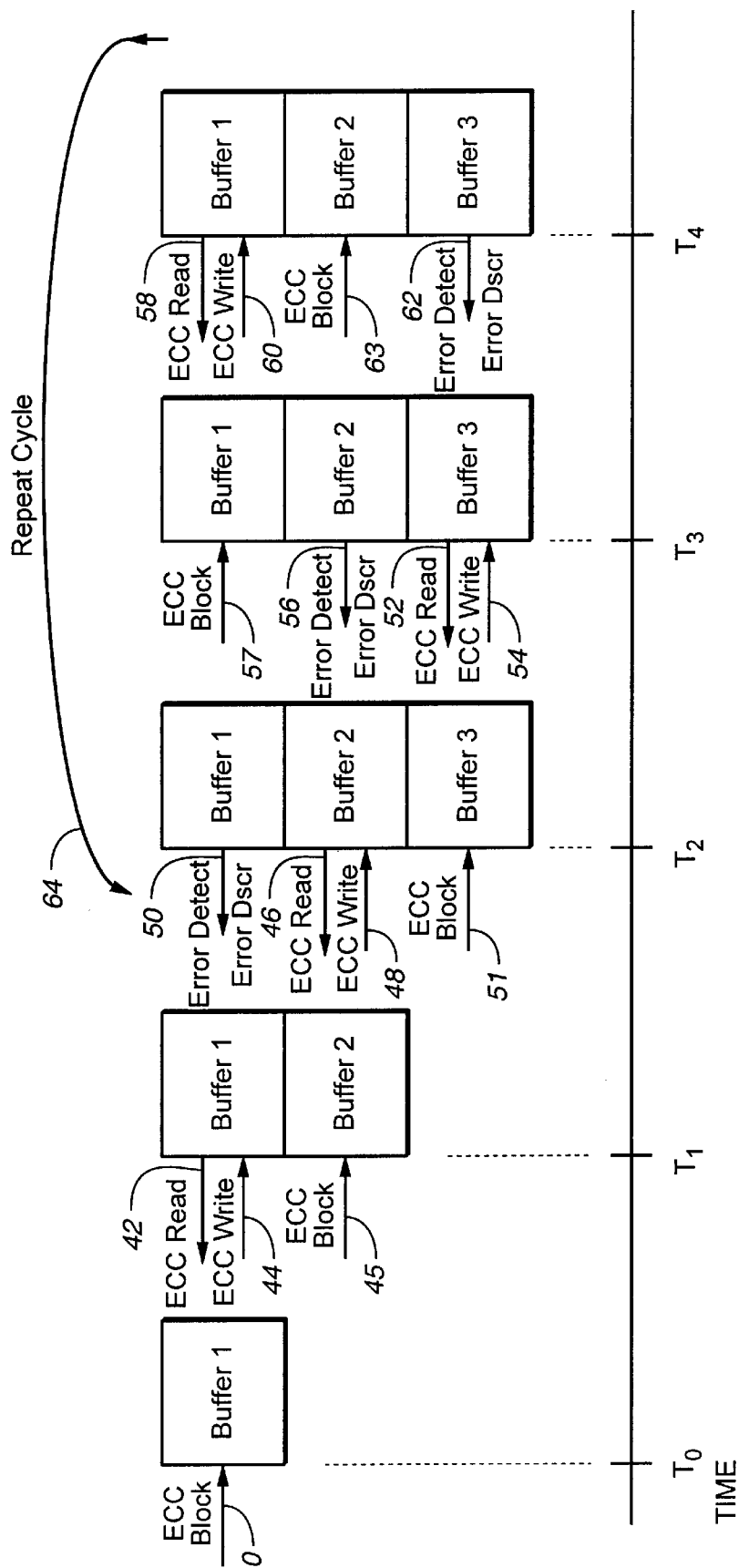
FIG._2B

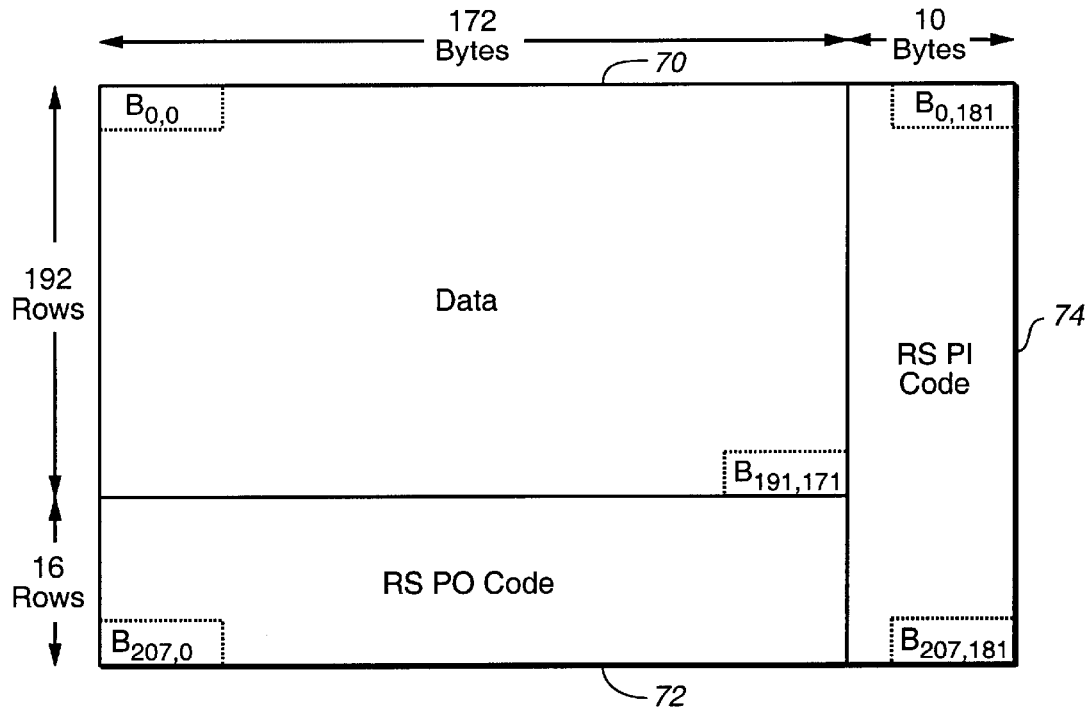
FIG._3
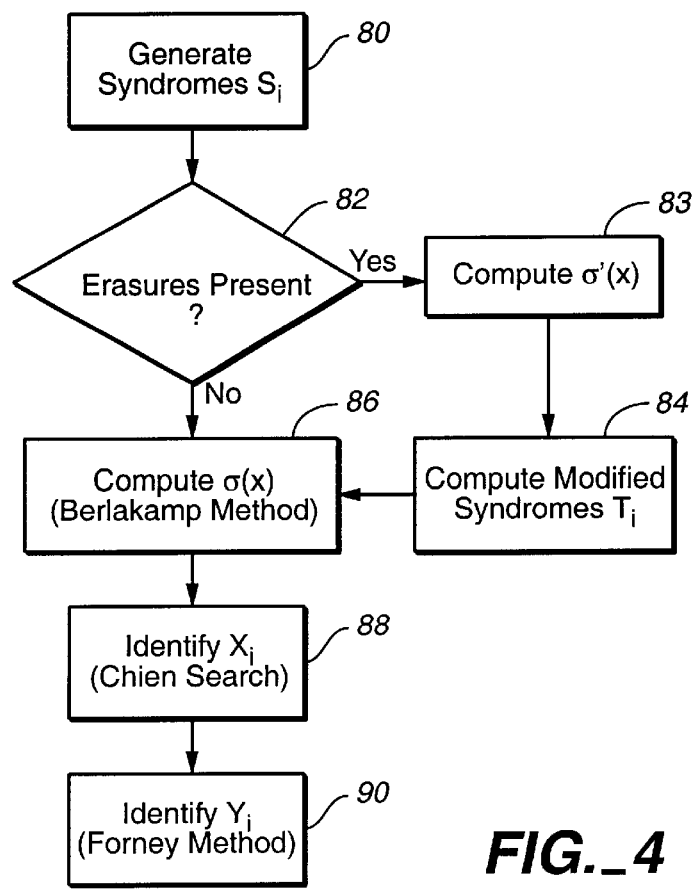
FIG._4

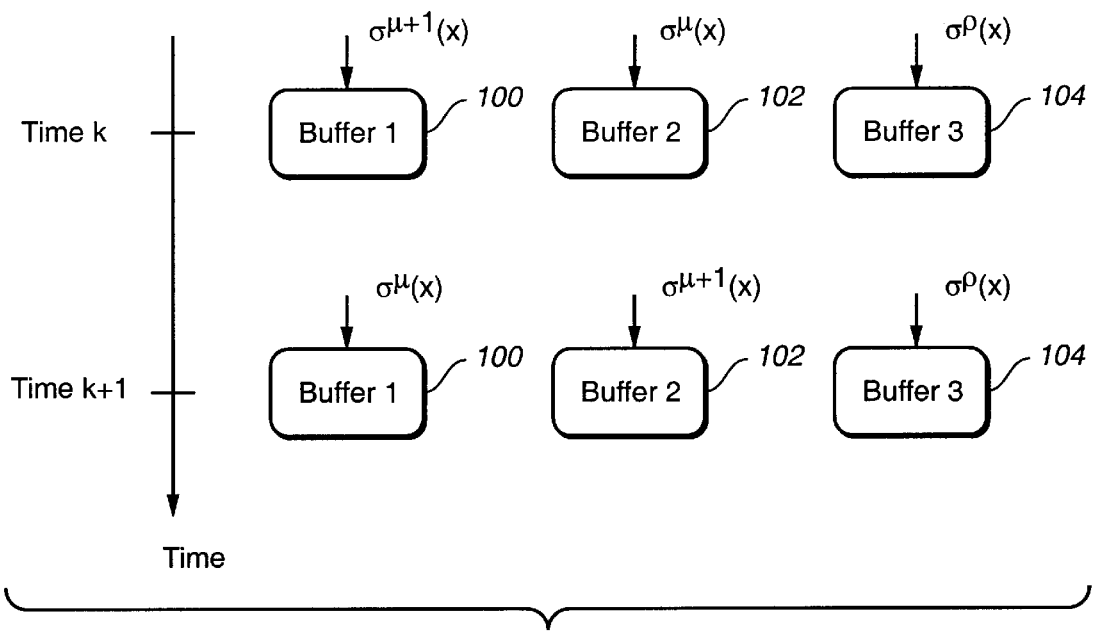
FIG._5
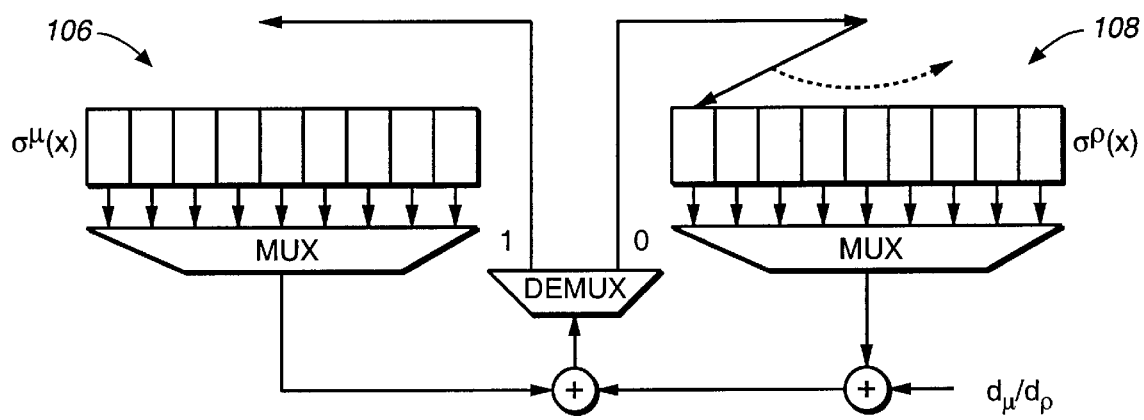
FIG._6A

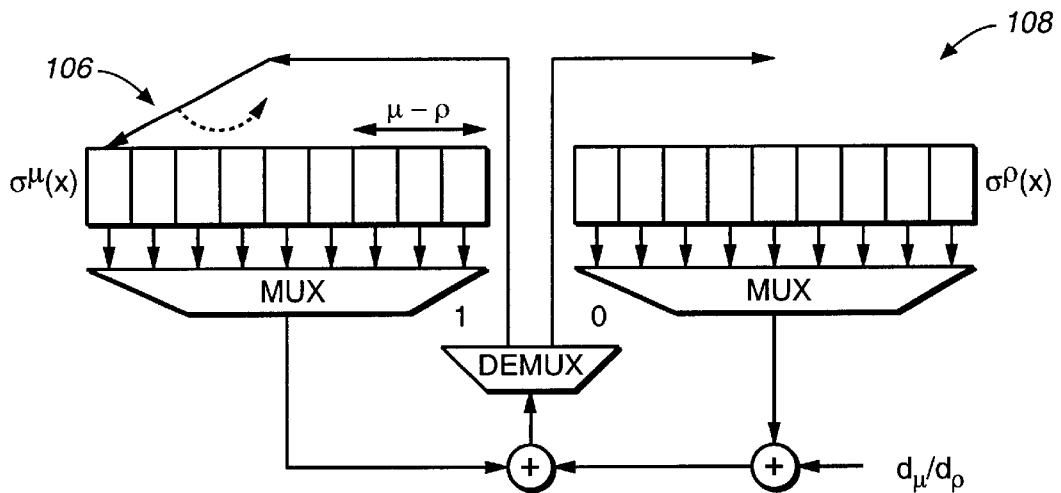
FIG._6B
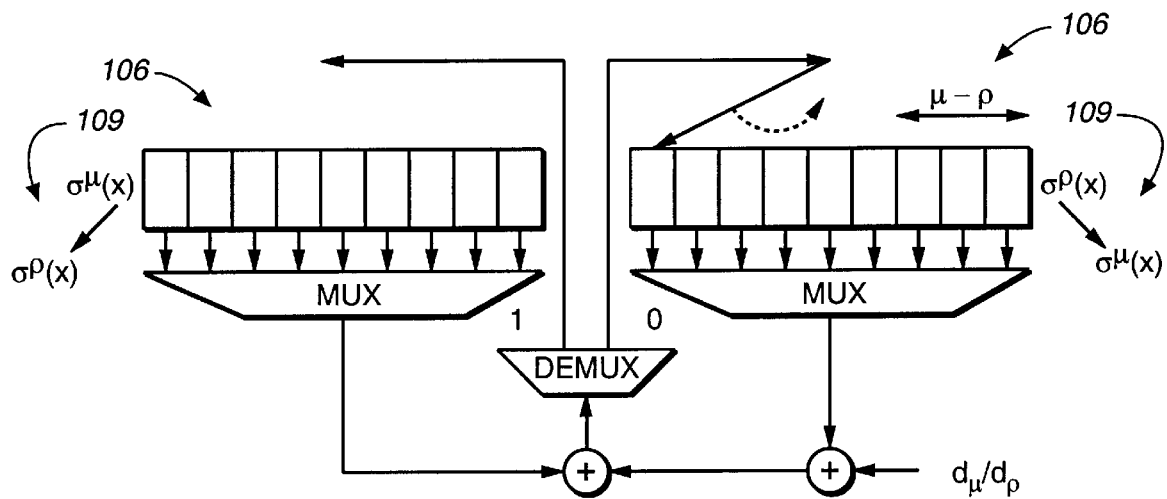
FIG._6C

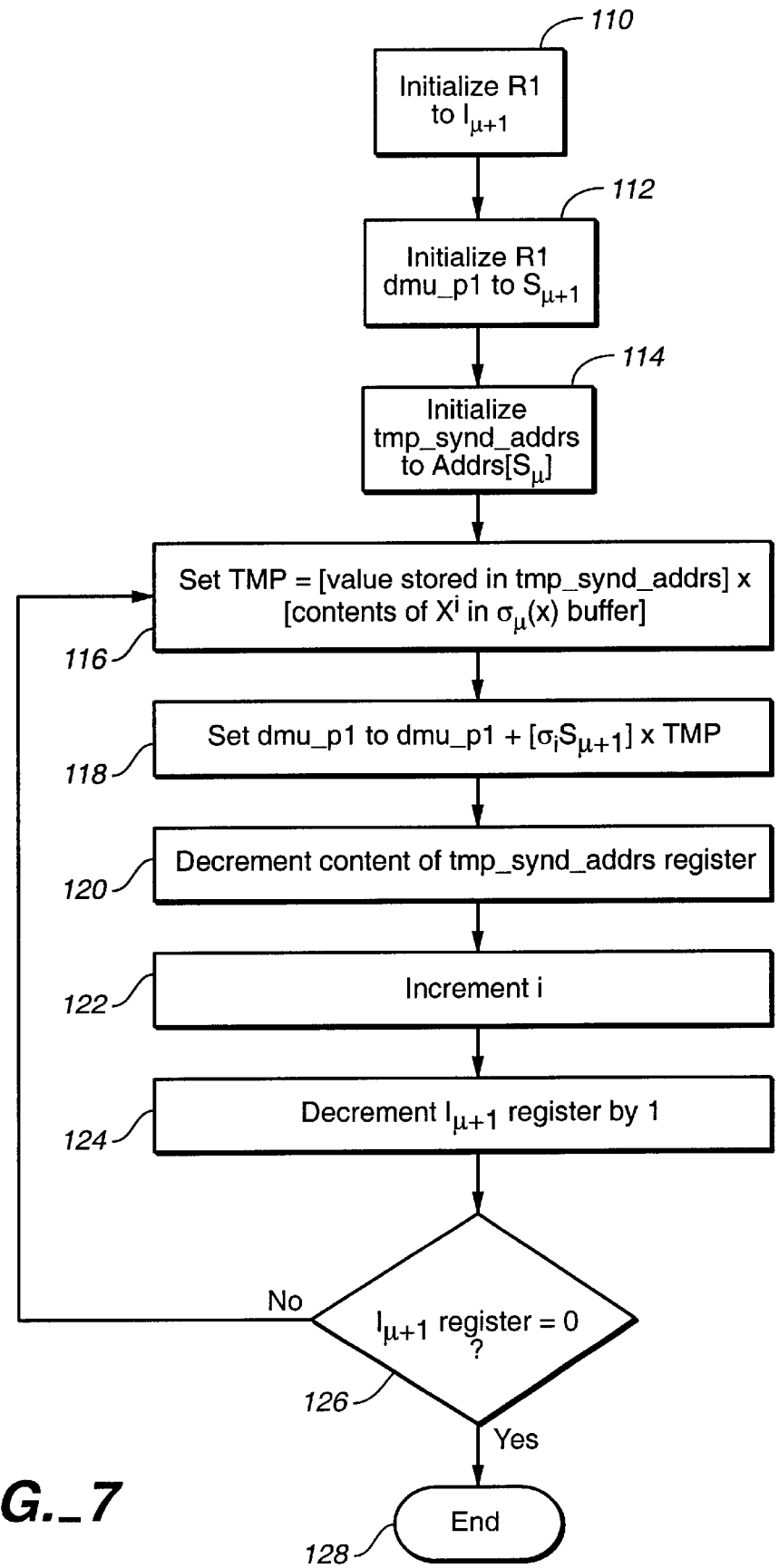
FIG._7

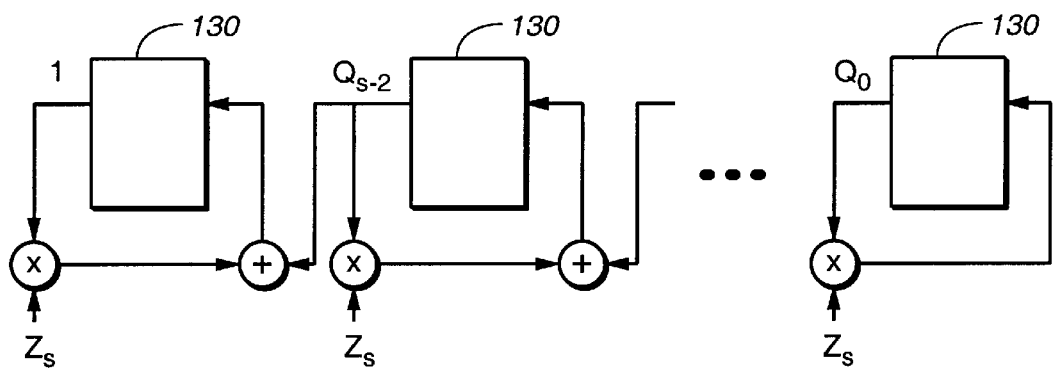
FIG._8A
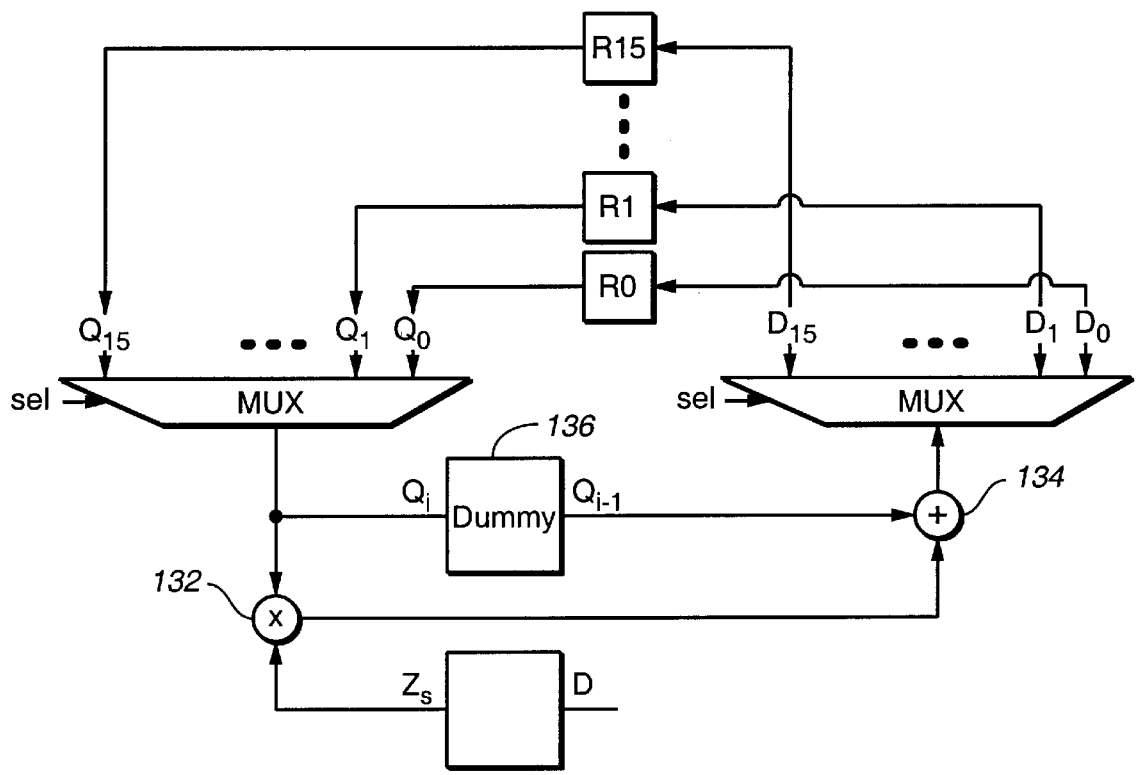
FIG._8B

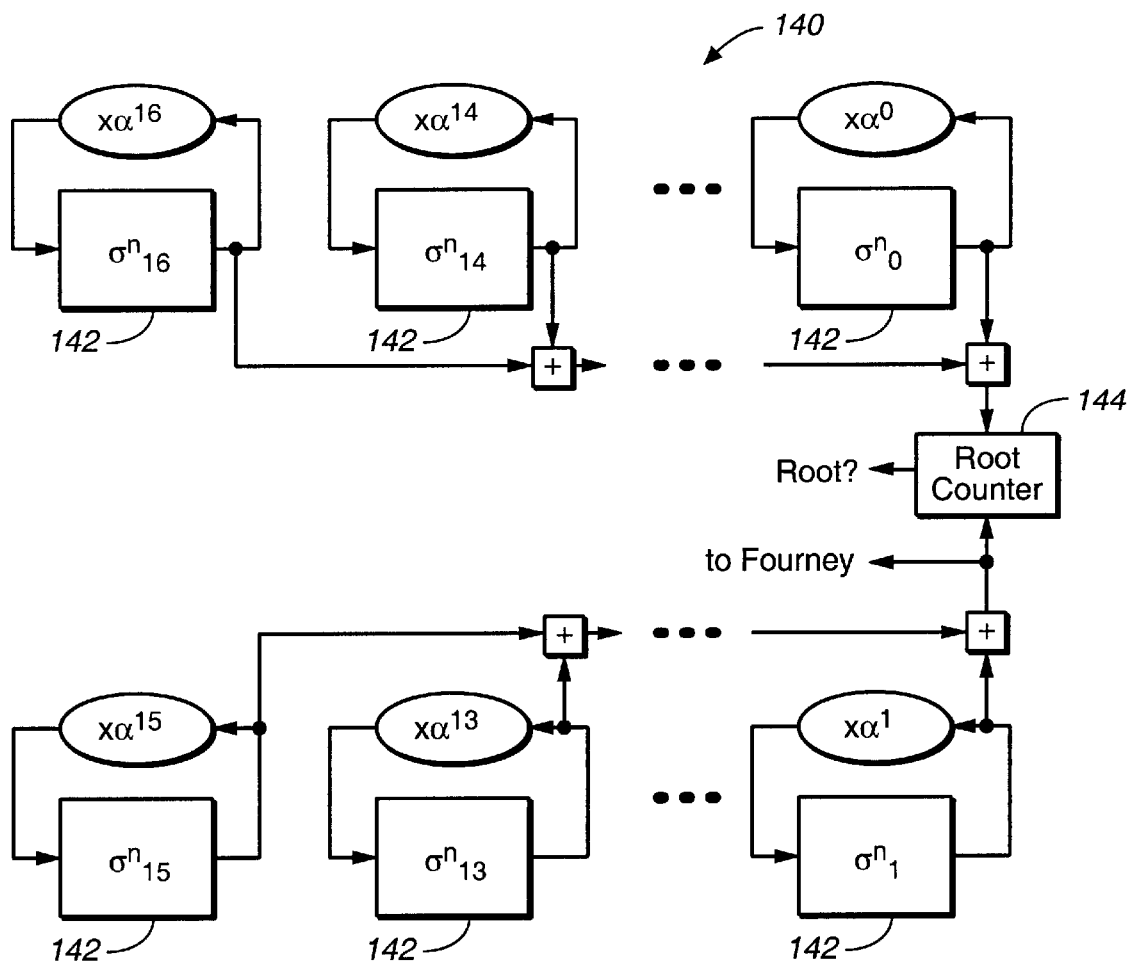
FIG._9

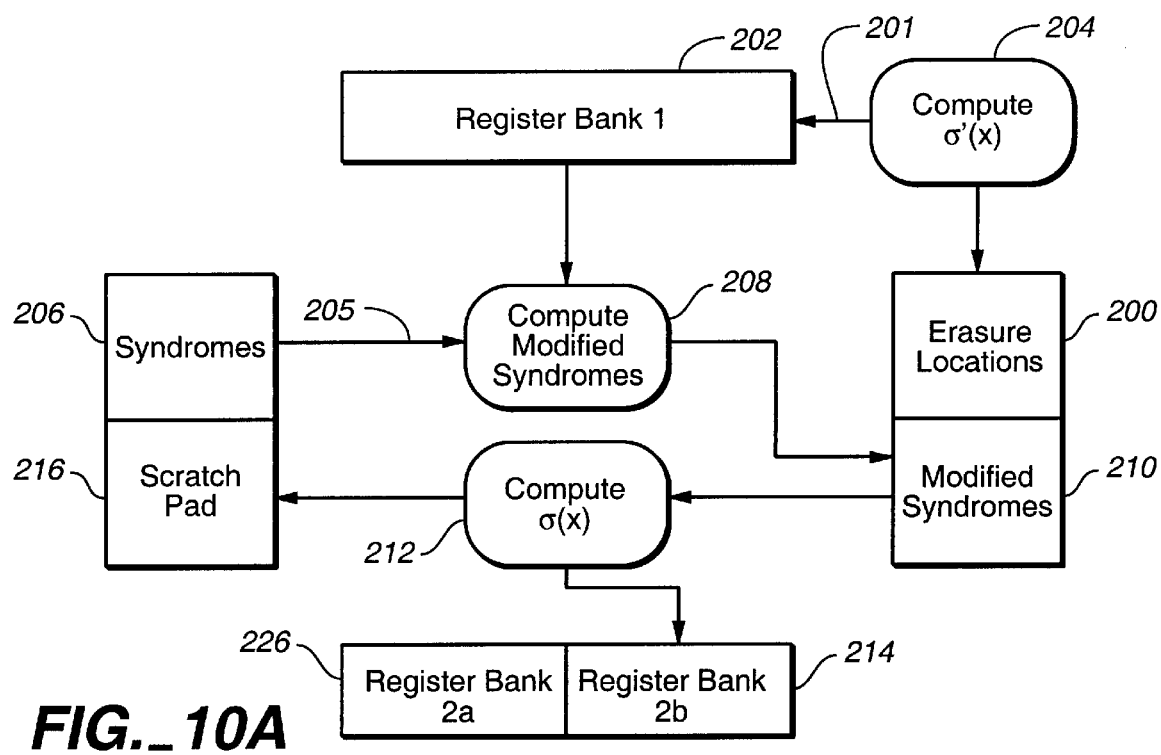
FIG._10A
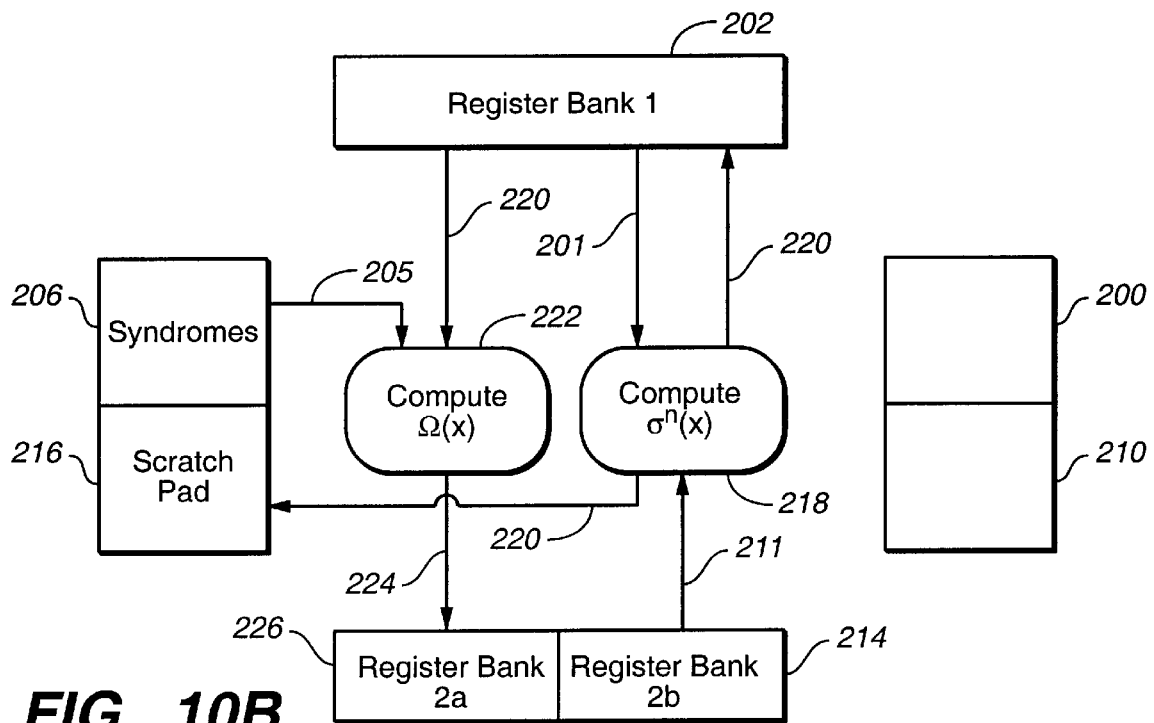
FIG._10B

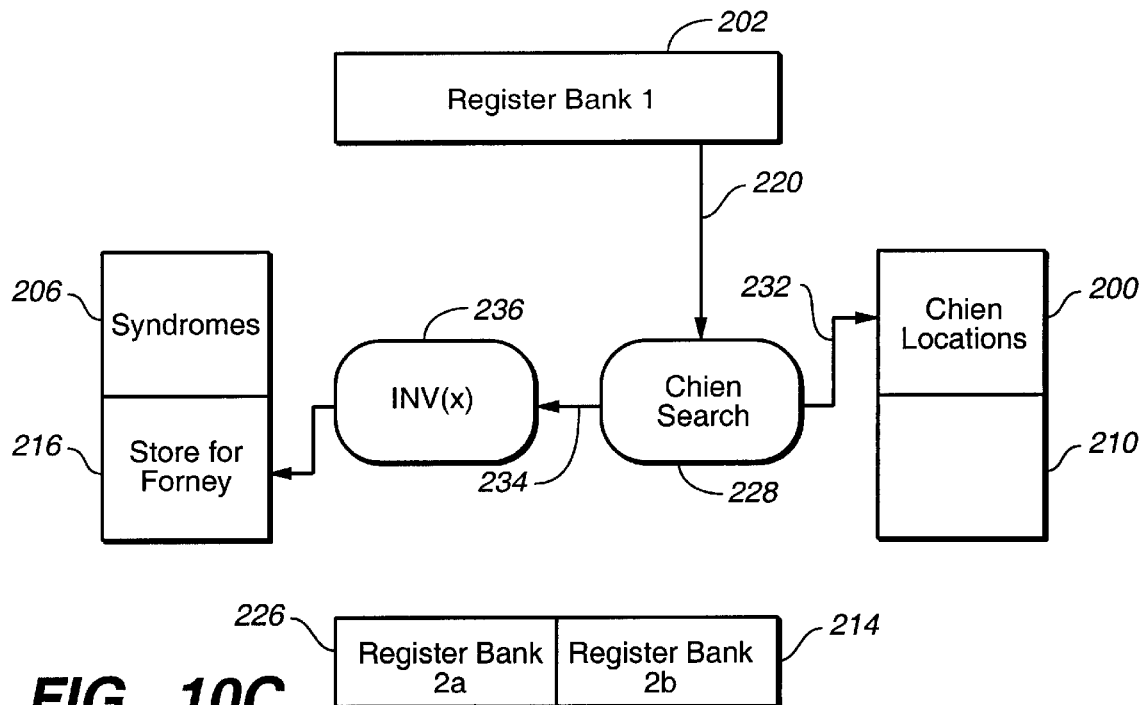
FIG._10C
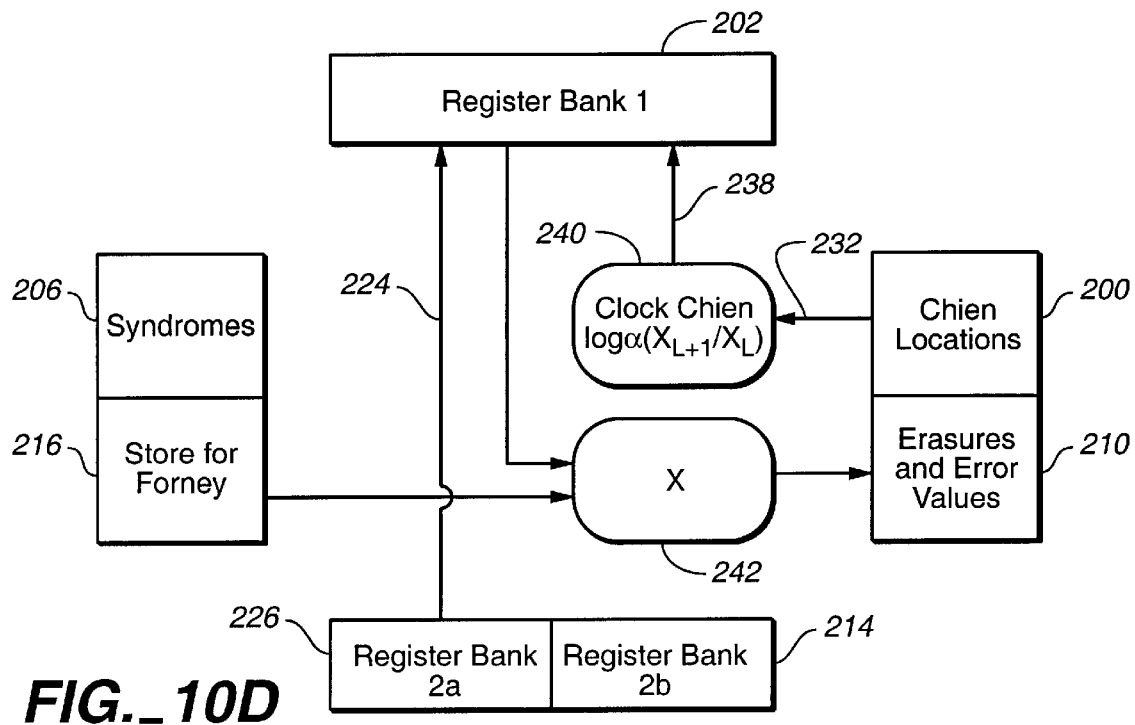
FIG._10D

FORWARD ERROR CORRECTION APPARATUS AND METHODS

BACKGROUND OF THE INVENTION

This invention relates to apparatus and methods of forward error correction.

Forward error correction techniques typically are used in digital communication systems (e.g., a system for reading information from a storage medium, such as an optical disk) to increase the rate at which reliable information may be transferred and to reduce the rate at which errors occur. Various errors may occur as data is being read from a storage medium, including data errors and erasures. Many forward error correction techniques use an error correction code to encode the information and to pad the information with redundancy (or check) symbols. Encoded information read from a storage medium may be processed to correct errors and erasures.

Reed-Solomon (RS) encoding is a common error correction coding technique used to encode digital information which is stored on storage media. A RS (n, k) code is a cyclic symbol error correcting code with k symbols of original data that have been encoded. An (n-k)-symbol redundancy block is appended to the data. The RS code represents a block sequence of a Galois field $GF(2^m)$ of $2^m$ binary symbols, where m is the number of bits in each symbol. Constructing the Galois field $GF(2^m)$ requires a primitive polynomial p(x) of degree m and a primitive element $\beta$, which is a root of p(x). The powers of $\beta$ generate all non-zero elements of $GF(2^m)$. There also is a generator polynomial g(x) which defines the particular method of encoding. A RS decoder performs Galois arithmetic to decode the encoded data. In general, RS decoding involves generating syndrome symbols, computing (e.g., using a Berlekamp computation process) the coefficients $\sigma_i$ of an error location polynomial $\sigma(x)$, using a Chien search process to determine the error locations based upon the roots of $\sigma(x)$, and determining the value of the errors and erasures. After the error locations have been identified and the values of the errors and erasures have been determined, the original data that was read from the storage medium may be corrected, and the corrected information may be transmitted for use by an application (e.g., a video display or an audio transducer).

SUMMARY OF THE INVENTION

In one aspect, the invention features an apparatus for computing the coefficients of a k-th degree erasure polynomial, comprising: k registers for storing k coefficient values of the erasure polynomial, each register having an input and an output; a dummy register having an input coupled to receive a coefficient value from the output of one of the k registers and having an output; an input register location having an input and an output; a multiplier having a first input coupled to the output of the input register, a second input coupled to receive a coefficient value from one of the k registers, and an output; and an adder having a first input coupled to the output of the multiplier, a second input coupled to the output of the dummy register, and an output coupled to the input of the k registers.

The input of the input register preferably is coupled to a memory configured to store a value representative of the root of the erasure polynomial. A controller configured to initialize each of the k registers to 1 and to initialize the dummy register to 0 may be provided. A multiplexer may be coupled between the output of the k registers and the input of the dummy register and the second input of the multiplier. A demultiplexer may be coupled between the inputs of the k registers and the output of the adder.

In another aspect, the invention features a method of computing the coefficients of a k-th degree erasure polynomial corresponding to k known erasure locations, comprising: (a) multiplying an erasure location and the output of a given register in a series of k registers to produce a product; (b) if there is a register immediately preceding the given register in the series of registers, adding the product to the output of the preceding register to produce a sum; (c) applying the sum (or the product, if a sum was not produced) to the input of the given register; (d) repeating steps (a)–(c) for each of the registers in the series; (e) clocking each of the registers in the series to transmit register input values to register outputs; and (f) repeating steps (a)–(e) for each of the erasure locations.

The output of a first register may be initialized to 1, and the outputs of the remaining registers may be initialized to 0.

In another aspect, the invention features a method of computing the coefficients of a k-th degree erasure polynomial corresponding to k known erasure locations, comprising: (a) applying an erasure location to an input of a input register; (b) multiplying an output of a given register in a series of registers and an output of the input register to produce a product; (c) adding the product and an output of the dummy register to produce a sum; (d) applying the sum to an input of a subsequent register immediately following the given register; and (e) treating the subsequent register as the given register and repeating steps (a)–(d) for each of the erasure locations.

The output of each of the registers in the series may be initialized to 1, the dummy register may be initialized to 0, and the input of a first of the series of registers may be initialized to an erasure location.

The invention also features an apparatus for the Berlekamp computation of the coefficients of an error location polynomial, comprising: first and second polynomial containers each configured to store n coefficients of a polynomial; first and second multiplexers each having n inputs coupled to receive a respective coefficient from the first and second polynomial containers, respectively, and each having an output; an adder having a first input coupled to the output of the first multiplexer, a second input, and an output; a multiplier having a first input coupled to the output of the second multiplexer, a second input, and an output coupled to the second input of the adder; and a demultiplexer having an input coupled to the output of the adder, a first output coupled to store a polynomial coefficient in the first polynomial container, and a second output coupled to store a polynomial coefficient in the second polynomial container.

A memory may have an output coupled to the second input of the multiplier and may be configured to stored intermediate values computed during implementation of a Berlekamp method of computing the coefficients of the error location polynomial. A controller may be configured to switch the identities of the first and second polynomial containers.

Among the advantages of the invention are the following. The invention provides hardware support that significantly increases the rate at which error and erasure polynomials may be computed using a relatively small number of hardware components. The invention therefore enables forward error correction techniques to be implemented in a high speed digital signal processing chip. The invention provides a relatively simple micro-sequencer-based forward error corrector design that may be implemented with a relatively small number of circuit components, and provides improved programming functionality.

Other features and advantages will become apparent from the following description, including the drawings and the claims.

BRIEF DESCRIPTION OF THE DRAWINGS

FIG. 1 is a block diagram of a system for reading encoded information from a storage disk.

FIG. 2A is a block diagram of an error correction digital signal processor (DSP).

FIG. 2B is a flow diagram of a cyclic three-buffer process for managing memory space in a method of correcting errors and erasures in an encoded block of data.

FIG. 3 is a diagrammatic view of an error correction code (ECC) block.

FIG. 4 is a flow diagram of a method of identifying error locations and determining error and erasure values.

FIG. 5 is a block diagram of a three-buffer method of computing an error location polynomial using the Berlekamp error correction algorithm.

FIGS. 6A–6C are block diagrams of a two-buffer method of computing an error location polynomial using the Berlekamp error correction algorithm.

FIG. 7 is a flow diagram of a method of updating intermediate values required to implement the Berlekamp error correction algorithm.

FIG. 8A is a block diagram of a multiplier for computing an erasure location polynomial.

FIG. 8B is a block diagram of another multiplier for computing an erasure location polynomial.

FIG. 9 is an apparatus for searching for the roots of a composite error location polynomial.

FIGS. 10A–10D are block diagrams of a method of computing errors and erasures.

DETAILED DESCRIPTION

Referring to FIG. 1, a system 10 for reading encoded information from a storage disk 12 (e.g., a magnetic memory disk, a compact disk (CD), or a digital video disk (DVD)) includes a read head 14, a demodulator 16, an error correction digital signal processor (EC DSP) 18, and an audio-video (AV) decoder 20. In operation, read head 14 scans the surface of storage disk 12 and reads data stored on storage disk 12 with a magnetic transducer or an optical transducer.

The data preferably is encoded with a RS cyclic redundancy code. Demodulator 16 extracts digital information from the signal produced by read head 14. EC DSP 18 synchronizes to the extracted digital information, performs a 16-bit to 8-bit conversion and, as explained in detail below, corrects the extracted information based upon the redundant information encoded into the information stored on storage disk 12. In particular, EC DSP 18 identifies error locations and determines the values of errors and erasures to correct the information read from storage disk 12. AV decoder 20 generates audio and video data signals from the corrected data signal received from EC DSP 18. The audio and video data signals may be transmitted to an application unit (e.g., a television or a computer) to present the audio and video signals to a user.

As shown in FIG. 2A, data that is read from storage disk 12 enters EC DSP 18 as a RZ signal with sample clock or as an NRZ signal without a sample clock. The NRZ signal passes through a bit clock regenerator 22 which performs a clock recovery operation on the signal. EC DSP includes a multiplexor 24, a first stage processor 26, a subcode/ID processor 28, a memory interface 30, and an error corrector 32. Multiplexor 24 transmits the data signal to first stage processor 26 that performs the processes of synchronization, demodulation, and deinterleaving. After these processes have been performed, first stage processor 26 loads one error correction code (ECC) block into memory (see FIG. 3). Memory interface 30 reads the ECC block from memory and calculates syndromes, which are passed to error corrector 32. Error corrector 32 computes error locations and values and passes this information to memory interface 30, which writes this information back into the memory locations from which memory interface 30 originally retrieved the erroneous data. Memory interface 30 descrambles the corrected data, checks the data for errors, and places the corrected data into a track buffer from which AV decoder 20 will receive the corrected data.

Referring to FIG. 2B, memory interface 30 facilitates decoding in real time by cycling through three separate buffer locations as follows. At time $T_0$, first stage processor 26 that performs the processes of synchronization, demodulation, and deinterleaving, and a first ECC block is stored in buffer 1 (step 40). At time $T_1$:

memory interface 30 reads the ECC block from buffer 1, calculates syndromes and passes the syndromes to error corrector 32 (step 42);

memory interface 30 writes the corrected error information to the corresponding memory locations in buffer 1 (step 44); and a second ECC block is stored in buffer 2 (step 45).

At time $T_2$:

memory interface 30 reads the ECC block from buffer 2, calculates syndromes and passes the syndromes to error corrector 32 (step 46);

memory interface 30 writes the corrected error information to the corresponding memory locations in buffer 2 (step 48);

memory interface 30 descrambles the corrected data in buffer 1, checks the data for errors, and places the corrected data into a track buffer from which AV decoder 20 will receive the corrected data (step 50); and a third ECC block is stored in buffer 3 (step 51).

At time $T_3$:

memory interface 30 reads the ECC block from buffer 3, calculates syndromes and passes the syndromes to error corrector 32 (step 52);

memory interface 30 writes the corrected error information to the corresponding memory locations in buffer 3 (step 54);

memory interface 30 descrambles the corrected data in buffer 2, checks the data for errors, and places the corrected data into a track buffer from which AV decoder 20 will receive the corrected data (step 56); and a third ECC block is stored in buffer 1 (step 57).

At time $T_4$:

memory interface 30 reads the ECC block from buffer 1, calculates syndromes and passes the syndromes to error corrector 32 (step 58);

memory interface 30 writes the corrected error information to the corresponding memory locations in buffer 1 (step 60);

memory interface 30 descrambles the corrected data in buffer 3, checks the data for errors, and places the corrected data into a track buffer from which AV decoder 20 will receive the corrected data (step 62); and a third ECC block is stored in buffer 2 (step 63).

The decoding of subsequent ECC blocks continues by cycling through the process steps of times $T_2$, $T_3$ and $T_4$ (step 64).

Referring to FIG. 3, the ECC block loaded into memory by first stage processor 26 includes a data block 70, an RS PO block 72, and an RS PI block 74. Data block 70 consists of 192 rows of data, each containing 172 bytes ($B_{ij}$). RS PO block 72 consists of 16 bytes of parity added to each of the 172 columns of data block 70. The parity was generated using a (208, 192) RS code and a generator polynomial given by $$G_{PO}(x) = \prod_{i=0}^{15} (x + \alpha^i)$$

RS PI block 74 consists of 10 bytes of parity added to each of the 208 rows forming data block 70 and RS PO block 72. The parity was generated using a (182, 172) RS code and a generator polynomial given by $$G_{PI}(x) = \prod_{i=0}^{9} (x + \alpha^i)$$

For both the (208, 192) and (182, 172) RS codes, the primitive polynomial is given by $P(x)=x^8+x^4+x^3+x^2+1$. The resultant ECC block contains 37,856 bytes.

Referring to FIG. 4, in one embodiment, error corrector 32 identifies error locations and determines values for errors and erasures as follows. Syndromes $S_i$ are generated by memory interface 30 by evaluating the received data at $\alpha^i$ (step 80). If there are erasures present (step 82), an erasure location polynomial $\sigma'(x)$ is computed, and a set of modified syndromes $T_i$ is computed (step 84). Error location polynomial $\sigma(x)$ is computed using Berlekamp's method (step 86). Error locations $X_L$ are identified using a Chien search (step 88). Finally, Forney's method is used to identify error and erasure values $Y_L$ (step 90).

Each of the steps 80–90 is described in detail below.

Generating Syndromes (Step 80)

Assuming that the transmitted code vector is $v(x)=\Sigma v_j x^j$ (where j=0 to n-1) and that the read channel introduces the error vector $e(x)=\Sigma e_j x^j$ (where j=0 to n-1), the vector received by error corrector 32 is given by $r(x)=v(x)+e(x)$. The $i^{th}$ syndrome is defined as $S_i=r(\alpha^i)$. Accordingly, by evaluating the received signal $r(x)$ at $\alpha^i$, each of the syndromes $S_i$ may be generated No Erasures Are Present (Step 82)

If no erasures are present (step 82; FIG. 4), error locations and error values may be determined as follows.

Computing Error Location Polynomial (Berlekamp's Method) (Step 86)

The error location polynomial is given by $\sigma(x)=\Pi(1+xX_j)=\Sigma\sigma_j x^j+1$, where j=1 to t and $X_j$ correspond to the error locations. Thus, the error locations $X_L$ may be determined by identifying the roots of $\sigma(x)$.

Berlekamp's method is used to compute the coefficients $\sigma_i$ of $\sigma(x)$ based upon the generated syndrome values $S_i$. In accordance with this approach, the following table is created with the values for the first rows entered as shown:

TABLE 1

Berlekamp's Method

| $\mu$ | $\sigma^\mu(x)$ | $d_\mu$ | $1_\mu$ | $\mu - 1_\mu$ |
|---|---|---|---|---|
| -1 | 1 | 1 | 0 | -1 |
| 0 | 1 | $S_0$ | 0 | 0 |
| 1 | | | | |
| 2 | | | | |
| ... | | | | |
| 2t | | | | |

The remaining entries are computed iteratively one row at a time. The $(u+1)^{th}$ is computed from the prior completed rows as follows:

if $d_\mu=0$, then $\sigma^{\mu+1}(x)=\sigma^\mu(x)$ and $1_{\mu+1}=1_\mu$;

if $d_\mu\neq 0$, identify another row p which is prior to the $\mu^{th}$ row such that $d_p\neq 0$ and the number $p-1_p$ (last column of Table 1) has the largest value, and compute the following:

$\sigma^{\mu+1}(x)=\sigma^\mu(x)+d_\mu d_p^{-1}x^{\mu-p}\sigma^p(x)$;

$1_{\mu+1}=\max(1_\mu,1_p+\mu-p)$;

$d_{\mu+1}=S_{\mu+1}+\sigma_1^{\mu+1}(x)S_\mu+\sigma_2^{\mu+1}(x)S_{\mu-1}+ \ldots +\sigma_{1_{\mu+1}}^{\mu+1}(x)S_{\mu-1-1_{\mu+1}}$ The method is initialized with $\mu=0$ and $p=-1$. The coefficients $\sigma_i$ of $\sigma(x)$ are computed by the time the bottom row of Table 1 has been completed because $\sigma(x)=\sigma^{2t}(x)$.

The above method may be implemented by maintaining $\sigma^{\mu+1}(x)$, $\sigma^\mu(x)$, and $\sigma^p(x)$ in three registers, computing $\sigma^{\mu+1}(x)$ with one cycle updates, and computing $d_{\mu+1}$ with one hardware instruction.

Referring to FIG. 5, in one embodiment, $\sigma^{\mu+1}(x)$, $\sigma^\mu(x)$, and $\sigma^p(x)$ are maintained in three polynomial buffers 100, 102, 104 (8-bit wide registers). At time k, $\sigma^{\mu+1}(x)$ is stored in buffer 1, $\sigma^\mu(x)$ is stored in buffer 2, and $\sigma^p(x)$ is stored in buffer 3. At time k+1, $\sigma^{\mu+1}(x)$ is stored in buffer 2, $\sigma^\mu(x)$ is stored in buffer 1, and $\sigma^p(x)$ is stored in buffer 3. At the end of each iteration, the pointers for $\sigma^{\mu+1}(x)$, $\sigma^\mu(x)$ and $\sigma^p(x)$ are updated to reflect the buffers in which the respective polynomials are stored. In this embodiment, the column values for $d_\mu$, $1_\mu$, and $\mu-1_\mu$ are stored in RAM.

Referring to FIGS. 6A–6C, in another embodiment, $\sigma^{\mu+1}(x)$, $\sigma^\mu(x)$, and $\sigma^p(x)$ are maintained in two registers 106, 108; the column values for $d_\mu$, $1_\mu$, and $\mu-1_\mu$ are stored in RAM. With a software-controlled bank switch option, a customized hardware instruction may be used to update $\sigma^{\mu+1}(x)$ from $\sigma^\mu(x)$ using registers 106, 108 as follows:

(1) At time k, if $d_\mu=0$ and $p-1_p\geq\mu-1_\mu$, then $\sigma^{\mu+1}(x)=\sigma^\mu(x)$, and $\sigma^p(x)$ does not change. At time k+1, $\sigma^{\mu+1}(x)$ and $\sigma^\mu(x)$ remain in their current buffers and $d_{\mu+1}$ is recomputed and saved to memory along with the value of $(\mu+1-1_{\mu+1})$.

(2) At time k, if $d_\mu=0$ and $p-1_p<\mu-1_\mu$, then $\sigma^{\mu+1}(x)=\sigma^\mu(x)$ and $\sigma^p(x)=\sigma^\mu(x)$. At time k+1, the buffer containing $\sigma^p(x)$ at time k is updated with $\sigma^\mu(x)$, $d_{\mu+1}$ is recomputed and saved to memory along with the value of $(\mu+1-1_{\mu+1})$, and $d_p$, $1_p$, and $p-1_p$ are updated in RAM (FIG. 6A).

(3) At time k, if $d_\mu\neq 0$ and $p-1_p\geq\mu-1_\mu$, then $\sigma^{\mu+1}(x)=\sigma^\mu(x)+d_\mu d_p^{-1}x^{\mu-p}\sigma^p(x)$ and $\sigma^p(x)=\sigma^p(x)$. At time k+1, the buffer containing $\sigma^\mu(x)$ at time k is updated with $\sigma^\mu(x)+d_\mu d_p^{-1}x^{\mu-p}\sigma^p(x)$ by updating the $x^8$ term in $\sigma^p(x)$ and progressing to $x^0$ FIG. 6B). If the degree of $x^{\mu-p}\sigma^p(x)>8$, then an uncorrectable bit is set in a register.

(4) At time k, if $d_\mu\neq 0$ and $p-1_p<\mu-1_\mu$, then $\sigma^{\mu+1}(x)=\sigma^\mu(x)+d_\mu d_p^{-1}x^{\mu-p}\sigma^p(x)$ and $\sigma^p(x)=\sigma^\mu(x)$. At time k+1, the buffer containing $\sigma^P(x)$ at time k is updated with $\sigma''(x)+d_\mu d_p^{-1}x^{\mu-P}\sigma^P(x)$. Software triggers a bank swap 109 between the two buffers, whereby the physical meaning of the two buffers is swapped. This allows the buffers to be updated simultaneously without any intermediary storage space. The updating begins with the $x^8$ term in $\sigma^P(x)$ and progressing to $x^0$. If the degree of $x^{\mu-P}\sigma^P(x)>8$, then an uncorrectable bit is set in a register (FIG. 6C).

Referring to FIG. 7, $d_{\mu 30\ 1}$ is computed with a customized hardware instruction as follows. A register R1 is initialized to $1_{\mu+1}$ (step 110). A register dmu_p1 is initialized to $S_{\mu+1}$ (step 112). A pointer tmp_synd_addrs is initialized to point to the address of $S_\mu$ (step 114). The value at the memory address identified in register tmp_synd_addrs is multiplied by the contents of $X^i$ stored in the buffer which contains $\sigma_\mu$ (step 116). The contents of register dmu_p1 are added to the product of the result obtained in step 116 (step 118). The content of the register identified by the pointer tmp_synd_addrs is decremented (step 120). The value of I is incremented by 1 (step 122). The $1_{\mu+1}$ register is decremented by 1 (step 124). If the value contained in the $1_{\mu+1}$ register is zero (step 126), the process is terminated (step 128); otherwise, the value stored in register tmp_$^{synd}$_addrs is multiplied by the contents of $X^i$ stored in the buffer which contains $\sigma_\mu$ (step 116) and the process steps 118–126 are repeated.

At the end of the above-described process (step 86), row 2t of Table 1 contains the coefficients $\sigma_i$ of the error location polynomial $\sigma(x)$ (i.e., $\sigma^{2t}(x) = \sigma^{2t(x)}$).

Identifying Error Locations (Chien Search) (Step 88)

Once the coefficients $\sigma_i$ of the error location polynomial $\sigma(x)$ have been computed, the error locations $X_L$ are determined by searching for the roots of $\sigma(x)$ using conventional Chien searching techniques.

Determining Error Values (Forney's Method) (Step 90)

Error values $Y_L$ are computed from the error locations $X_L$ and the syndromes $S_i$ as follows:

$$Y_i = \frac{\Omega(X_i^{-1})}{\prod_{j \neq i}\left(1 + \frac{X_j}{X_i}\right)},$$

where $\Omega(x) = S(x)\sigma(x) \pmod{x^{2t}}$ and $$S(x) = \sum_{k=1}^{2t} S_{k-1}x^{k-1}.$$

Erasures Are Present (Step 82)

If erasures are present (step 82; FIG. 4), error locations and error and erasure values may be determined as follows.

Computing Erasure Location Polynomial (Step 83)

An erasure location polynomial is defined as follows:

$$\sigma'(z)=\Pi(z+Z_j)=\Sigma\sigma'_{s-j}z^j+\sigma'_s (j=1 \text{ to } s),$$

where s is the number of erasures present and $Z_i$ are the known locations of the erasures. This expression may be rewritten as follows:

$$\sigma'(z)=(z^{s-1}+Q_{s-2}z^{s-2}+\ldots Q_1z+Q_0)\times(z+Z_s)=z^s+(Z_s+Q_{s-2})z^{s-1}+ (Q_{s-2}Z_s+Q_{s-3})z^{s-2}+\ldots (Q_1Z_s+Q_0)z+Q_0Z_s$$

Referring to FIG. 8A, in one embodiment, this expression for the erasure location polynomial $\sigma'(x)$ is computed recursively with s 8-bit wide registers 130. In operation, the following steps are performed: (a) an erasure location and the output of a given register in a series of k registers are multiplied to produce a product; (b) if there is a register immediately preceding the given register in the series of registers, the product is added to the output of the preceding register to produce a sum; (c) the sum (or the product, if a sum was not produced) is applied to the input of the given register; (d) steps (a)–(c) are repeated for each of the registers in the series; (e) each of the registers in the series is clocked to transmit register input values to register outputs; and (f) steps (a)–(e) are repeated for each of the erasure locations. The output of a first register is initialized to 1, and the outputs of the remaining registers is initialized to 0.

Referring to FIG. 8B, in another multiplier embodiment, a customized hardware instruction may be used to compute $\sigma'(x)$ using one multiplier 132 and one adder 134. In operation, the following steps are performed: (a) an erasure location is applied to an input of a input register; (b) an output of a given register in a series of registers and an output of the input register are multiplied to produce a product; (c) the product and an output of the dummy register are added to produce a sum; (d) the sum is applied to an input of a subsequent register immediately following the given register; (e) the subsequent register is treated as the given register and steps (a)–(d) are repeated for each of the erasure locations. For example, the multiplier may be cycled as follows:

cycle 1: initialize all registers to 1 and dummy register 136 to 0; set $D_0=Z_1$ and sel=0;
cycle 2: set $Q_0=Z_1$; set $D=Z_2$;
cycle 3: set $Z_s=Z_2$ and $D=Z_3$;
cycle 4: set $Q_{i-1}=Q_0$, $Q_0=D_0$, and sel=1;
cycle 5: set $Q_1=D_1$, sel=0, $Z_s=Z_3$, and $D=Z_4$.

The performance of cycles 1–5 results in the computation of two erasure multiplications. $Q_2$, $Q_1$ and $Q_0$ now hold the second degree erasure polynomial whose roots are $Z_1$ and $Z_2$. Additional multiplications may be computed by continuing the sequence of cycles.

The erasure location polynomial $\sigma'(x)$ is used to compute modified syndrome values $T_i$ as follows.

Computing Modified Syndromes (step 84)

The modified syndromes $T_i$ are defined as follows:

$$T_i = \sum_{j=0}^{s} \sigma'_j S_{i+s-j} \text{ for } 0 \leq i \leq 2t-s-1$$

Software running on the micro-sequencer may load $\sigma_j'$, $S_{i+s-j}$ from memory and perform the multiplication and accumulation. Th expression for $T_i$ may be rewritten as:

$$T_i = \sum_{m=1}^{a} E_m X_m^i, \text{ for } 0 \leq i \leq 2t-s-1$$

where $E_m=Y_m\sigma'(X_m)$, $\alpha$ corresponds to the number of errors, the values $X_m$ correspond to the unknown error locations, and the values $Y_m$ corresponds to the unknown error and erasure values.

The modified syndrome values $T_i$ may be used to compute the coefficients $\sigma_i$ of the error location polynomial $\sigma(x)$.

Computing Error Location Polynomial (Berlekamp's Method) (Step 86)

Because the modified syndromes represent a system of equations that are linear in $E_i$ and nonlinear in $X_i$, Berlekamp's method (described above; step 86) may be used to compute the coefficients $\sigma_i$ of the error location polynomial $\sigma(x)$ from the modified syndromes $T_i$ based upon the substitution of the modified syndrome values $T_i$ for the syndrome values $S_i$.

At the end of the process (step 86), Table 1 contains the coefficients $\sigma_i$ of the error location polynomial $\sigma(x)$.

Identifying Error Locations (Chien Search) (Step 88)

Once the coefficients $\sigma_i$ of the error location polynomial $\sigma(x)$ have been computed, the error locations $X_L$ may be determined by searching for the roots of $\sigma(x)$ using conventional Chien searching techniques.

In an alternative embodiment, the error locations $X_L$ are determined by searching for the roots of a composite error location polynomial $\sigma''(x)=x^s\sigma'(x^{-1})\sigma(x)$ using conventional Chien searching methods. This approach simplifies the hardware implementation needed to compute the error and erasure values.

During the Chien search, the following expressions are evaluated and tested for zero:

$$\sigma''(\alpha^{-0})=\sigma''(1)=\sigma''_{16}+\sigma''_{15}+\ldots+\sigma''_1+\sigma''_0$$

$$\sigma''(\alpha^{-1})=\sigma''(\alpha^{254})=\sigma''_{16}\alpha^{254\times16}+\sigma''_{15}\alpha^{254\times15}+\ldots+\sigma''_1\alpha^{254\times1}+\sigma''_0$$

$$\sigma''(\alpha^{-2})=\sigma''(\alpha^{253})=\sigma''_{16}\alpha^{253\times16}+\sigma''_{15}\alpha^{253\times15}+\ldots+\sigma''_1\alpha^{253\times1}+\sigma''_0$$

.
.
.

$$\sigma''(\alpha^{-207})=\sigma''(\alpha^{48})=\sigma''_{16}\alpha^{48\times16}+\sigma''_{15}\alpha^{48\times15}+\ldots+\sigma''_1\alpha^{48\times1}+\sigma''_0$$

Referring to FIG. 9, a circuit 140 may be used to evaluate the above expression. Circuit 140 is initialized to $\sigma''_{16}$, $\sigma''_{15}, \ldots, \sigma''_0$. In one operation, $\sigma''(1)$ is obtained. During the first 47 clocking cycles a root counter 144 is monitored for new roots and, when a new root is detected, a bit flag is set to high, indicating that an uncorrectable error has occurred. Each clock cycle from clock number 48 through clock number 254 generates $\sigma''(48)$ through $\sigma''(254)$. After the 254$^{th}$ cycle, firmware identified a data block as uncorrectable if: (1) the bit flag is set to high; or (2) value of root counter 144 does not equal v+s, where v is the power of $\sigma''(x)$ and s is the number of erasures.

In an alternative embodiment, the $\sigma''_0$ register is not included and, instead of testing against zero, the sum of the remaining registers is tested against 1.

At the end of the above-described process (step 88), the error locations $X_L$ have been identified. By performing a redundant Chien search on the composite error location polynomial $\sigma''(x)$, computation time and implementation complexity may be reduced relative to an approach that performs a Chien search on the error location polynomial $\sigma(x)$ because this redundant Chien search provides (through the "to Forney" signal) the value of the denominator $\sigma''_0 (X_L^{-1})$ for the error and erasure values $Y_L$, as described in the following section.

Determining Error and Erasure Values (Forney's Method) (Step 90)

The error and erasure values $Y_L$ are computed from the error locations $X_L$, the syndromes $S_i$ and a composite error location polynomial $\sigma''(x)$ as follows:

$$Y_i = \frac{\Omega(X_i^{-1})}{\prod_{j\neq i}\left(1+\frac{X_j}{X_i}\right)},$$

where $\Omega(x)=S(x)\sigma''(x)(\mod x^{2t})$, $S(x)=\Sigma S_{k-1}x^{k-1}$, and $\sigma''(x)=x^s\sigma'(x^{-1})\sigma(x)$. This expression may be rewritten as follows. Assuming $\tau=v+s$, $\sigma''(x)$ may be rewritten as:

$$\sigma''(x) = \sigma_\tau x^\tau + \sigma_{\tau-1}x^{\tau-1}+\ldots+\sigma_1 x^1+\sigma_0 = \prod_{j=1}^{\tau}(1+X_j x)$$

Based upon this result, the erasure value polynomial evaluated at $\sigma''(x)$ and $\sigma''(X_L^{-1})$ (i.e., $D_x(\sigma''(x))$ and $D_x(\sigma''(X_L^{-1}))$) may be given by:

$$D_x(\sigma''(x)) = \sum_{L=1}^{\tau}\prod_{j\neq L}X_L(1+X_j x) \text{ and}$$

$$D_x(\sigma''(X_L^{-1})) = X_L\prod_{j\neq L}\left(1+\frac{X_j}{X_L}\right)$$

The erasure location polynomial $\sigma''(x)$ may be rewritten in terms of its odd $\sigma_o''$ and even $\sigma_e''$ components: $\sigma''(x)=\sigma_o''(x)+\sigma_e''(x)$, where $\sigma_o''(x)=\sigma_1''x+\sigma_3''x^3+\ldots$ and $\sigma_e(x)=\sigma_0''+\sigma_2''x^2+\ldots$. Now, since the erasure value polynomial evaluated at $\sigma''(x)$ may be rewritten as: $D_x(\sigma''(x))=\sigma_1''+\sigma_3''x^2+\sigma_5''x^4+\ldots$, the following expression is true:

$$X_L^{-1}D_x(\sigma''(X_L^{-1}))=\sigma_1''X_L^{-1}+\sigma_3''X_L^{-3}+\sigma_5''X_L^{-5}+\ldots=\sigma_o''(X_L^{-1})$$

Accordingly, $$\sigma_o''(X_L^{-1}) = \prod_{j\neq L}\left(1+\frac{X_j}{X_L}\right).$$

Thus, the error and erasure values $Y_L$ may be given by:

$$Y_L = \frac{\Omega(X_L^{-1})}{\sigma_o''(X_L^{-1})}$$

The denominator of the above expression is obtained from the "to Forney" signal of FIG. 9. The numerator may be computed by initializing the flip flops 142 in FIG. 9 with the values of $\Omega_i$ rather than the values of $\sigma_i$; the values of $\Omega_i$ may be computed by software running on the microsequencer.

Memory Management

The rate at which signals are decoded may be increased by storing the results of the above-described algorithms in registers rather than in memory. In the following implementation, only sixteen registers are needed for performing the Chien search, and only eighteen registers are needed to implement Berlekamp's method (described above) for computing the coefficients $\sigma_i$ of the error location polynomial $\sigma(x)$ from the modified syndromes $T_i$. In this implementation, a micro-sequencer issues instructions that execute the decoding process and coordinate the flow of data into the registers and memory locations.

Referring to FIGS. 10A–10D, in one embodiment, errors and erasures may be computed by error corrector 32 implementing one or more of the above-described methods as follows. The following description assumes that errors and erasures are present in the received EC data block. In accordance with this method, error corrector 32 performs the following tasks serially: (1) compute the erasure location polynomial $\sigma'(x)$ for erasures; (2) compute the modified syndromes $T_i$; (3) perform Berlekamp's method to obtain the coefficients $\sigma_i$ of the error location polynomial $\sigma(x)$; (4) compute the composite error location polynomial $\sigma''(x)$; (5) compute the Chien polynomial $\Omega(x)$; (6) perform a redundant Chien search on σ"(x) to obtain the error locations $X_L$; and (7) evaluate $\Omega(X_L^{-1})$ to obtain the error and erasure values $Y_L$.

As shown in FIG. 10A, based upon the predetermined erasure locations, which are stored in RAM memory 200, the coefficients 201 of the erasure location polynomial σ'(x) are computed and stored in register bank 202 (step 204). The modified syndromes $T_i$ are computed based upon the coefficients of σ'(x) and the syndrome values 205 ($S_i$) which are stored in RAM memory 206 (step 208); the modified syndromes $T_i$ are stored in RAM memory 210. The modified syndromes $T_i$ are used to compute the coefficients 211 of error location polynomial σ(x) (step 212); these coefficients are stored in register bank 214 and in RAM memory 216.

Referring to FIG. 10B, composite error location polynomial σ"(x)(=$x^s$σ'($x^{-1}$)σ(x)) is computed based upon the stored coefficients 211 of the error location polynomial σ(x) and the stored coefficients 201 of the erasure location polynomial σ'(x) (step 218). The coefficients of σ"(x) are computed in software and are stored in RAM memory 216 and in register bank 202. The Chien polynomial Ω(x)(=S(x)σ"(x)) is computed based upon the stored coefficients 220 of σ"(x) and the stored syndrome values 205 ($S_i$) (step 222). The computed coefficient values 224 of Ω(x) are stored in register bank 226.

As shown in FIG. 10C, a Chien search is performed (step 228). During the Chien search, the values 232, 234 of $\log_\alpha(X_L^{-1})$ (Chien locations) and $\sigma_o"(X_L^{-1})$ are computed, respectively. The values 232 ($\log_\alpha(X_L^{-1})$) are written to RAM memory location 200. The inverses of values 234 ($\sigma_o"(X_L^{-1})$) are computed and stored in memory location 216 (step 236).

Referring to FIG. 10D, the coefficient values 224 of Ω(x) are written from register bank 226 to register bank 202. The values 238 ($\log_\alpha(X_{L+1}/X_L)$) are clocked into register bank 202 (step 240). The errors and erasures values $Y_L$ are computed by multiplying the inverse of the composite error location polynomial evaluated at error location $X_L$ and the Chien polynomial values evaluated at $X_L$ (step 242):

$$Y_L = \frac{\Omega(X_L^{-1})}{\sigma_o"(X_L^{-1})}$$

The computed error and erasure values $Y_L$ are stored in RAM memory 210.

Other embodiments are within the scope of the claims

What is claimed is:

1. An apparatus for computing the coefficients of a k-th degree erasure polynomial, comprising:
    k registers for storing k coefficient values of the erasure polynomial, each register having an input and an output;
    a dummy register having an input coupled to receive a coefficient value from the output of one of the k registers and having an output;
    an input register location having an input and an output;
    a multiplier having a first input coupled to the output of the input register, a second input coupled to receive a coefficient value from one of the k registers, and an output; and
    an adder having a first input coupled to the output of the multiplier, a second input coupled to the output of the dummy register, and an output coupled to the input of the k registers.

2. The apparatus of claim 1, wherein the input of the input register is coupled to a memory configured to store a value representative of the root of the erasure polynomial.

3. The apparatus of claim 1, further comprising a controller configured to initialize each of the k registers to 1 and to initialize the dummy register to 0.

4. The apparatus of claim 1, further comprising a multiplexer coupled between the output of the k registers and the input of the dummy register and the second input of the multiplier.

5. The apparatus of claim 1, further comprising a demultiplexer coupled between the inputs of the k registers and the output of the adder.

6. A method of computing the coefficients of a k-th degree erasure polynomial corresponding to k known erasure locations, comprising:
    (a) multiplying an erasure location and the output of a given register in a series of k registers to produce a product;
    (b) if there is a register immediately preceding the given register in the series of registers, adding the product to the output of the preceding register to produce a sum;
    (c) applying the sum (or the product, if a sum was not produced) to the input of the given register;
    (d) repeating steps (a)–(c) for each of the registers in the series;
    (e) clocking each of the registers in the series to transmit register input values to register outputs; and
    (f) repeating steps (a)–(e) for each of the erasure locations.

7. The method of claim 6, further comprising initializing the output of a first register to 1, and initializing the outputs of the remaining registers to 0.

8. A method of computing the coefficients of a k-th degree erasure polynomial corresponding to k known erasure locations, comprising:
    (a) applying an erasure location to an input of a input register;
    (b) multiplying an output of a given register in a series of registers and an output of the input register to produce a product;
    (c) adding the product and an output of the dummy register to produce a sum;
    (d) applying the sum to an input of a subsequent register immediately following the given register;
    (e) treating the subsequent register as the given register and repeating steps (a)–(d) for each of the erasure locations.

9. The method of claim 8, further comprising initializing the output of each of the registers in the series to 1, initializing the dummy register to 0, and initializing the input of a first of the series of registers to an erasure location.

10. An apparatus for the Berlekamp computation of the coefficients of an error location polynomial, comprising:
    first and second polynomial containers each configured to store n coefficients of a polynomial;
    first and second multiplexers each having n inputs coupled to receive a respective coefficient from the first and second polynomial containers, respectively, and each having an output;
    an adder having a first input coupled to the output of the first multiplexer, a second input, and an output;
    a multiplier having a first input coupled to the output of the second multiplexer, a second input, and an output coupled to the second input of the adder; and a demultiplexer having an input coupled to the output of the adder, a first output coupled to store a polynomial coefficient in the first polynomial container, and a second output coupled to store a polynomial coefficient in the second polynomial container.

11. The apparatus of claim 10, further comprising a memory having an output coupled to the second input of the multiplier and being configured to stored intermediate values computed during implementation of a Berlekamp method of computing the coefficients of the error location polynomial.

12. The apparatus of claim 10, further comprising a controller configured to switch the identities of the first and second polynomial containers.

* * * * *